(12) United States Patent
Lin et al.

(10) Patent No.: US 12,227,865 B2
(45) Date of Patent: Feb. 18, 2025

(54) PLATING APPARATUS AND METHOD FOR ELECTROPLATING WAFER

(71) Applicant: TAIWAN SEMICONDUCTOR MANUFACTURING COMPANY LIMITED, Hsin-Chu (TW)

(72) Inventors: Che-Min Lin, Kaohsiung (TW); Hung-San Lu, Tainan (TW); Chao-Lung Chen, Tainan (TW); Chao Yuan Chang, Tainan (TW); Chun-An Kung, Yuanlin (TW); Chin-Hsin Hsiao, Tainan (TW); Wen-Chun Hou, Tainan (TW); Szu-Hung Yang, Tainan (TW); Ping-Ching Jiang, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 71 days.

(21) Appl. No.: 17/872,366

(22) Filed: Jul. 25, 2022

(65) Prior Publication Data
US 2022/0356594 A1 Nov. 10, 2022

Related U.S. Application Data

(62) Division of application No. 16/935,592, filed on Jul. 22, 2020, now Pat. No. 11,401,624.

(51) Int. Cl.
*C25D 17/00* (2006.01)
*C25D 7/12* (2006.01)
*H01L 21/288* (2006.01)

(52) U.S. Cl.
CPC ............ *C25D 17/008* (2013.01); *C25D 7/12* (2013.01); *C25D 17/001* (2013.01); *C25D 17/002* (2013.01); *H01L 21/2885* (2013.01)

(58) Field of Classification Search
CPC .................................................. C25D 17/008
See application file for complete search history.

(56) References Cited

U.S. PATENT DOCUMENTS

2001/0050233 A1* 12/2001 Uzoh ................... C25D 17/008
205/291
2005/0056538 A1 3/2005 Kovarsky et al.
(Continued)

FOREIGN PATENT DOCUMENTS

| CN | 105821457 A | 8/2016 |
|---|---|---|
| CN | 208869681 U | 5/2019 |

(Continued)

OTHER PUBLICATIONS

First Office Action cited in corresponding Chinese patent application No. 202110270479.0, dated May 30, 2024, 20 pages.
(Continued)

*Primary Examiner* — Hosung Chung
(74) *Attorney, Agent, or Firm* — Cooper Legal Group, LLC

(57) ABSTRACT

A plating apparatus for electroplating a wafer includes a housing defining a plating chamber for housing a plating solution. A voltage source of the apparatus has a first terminal having a first polarity and a second terminal having a second polarity different than the first polarity. The first terminal is electrically coupled to the wafer. An anode is within the plating chamber, and the second terminal is electrically coupled to the anode. A membrane support is within the plating chamber and over the anode. The membrane support defines apertures, wherein in a first zone of the membrane support a first aperture-area to surface-area ratio is a first ratio, and in a second zone of the membrane support a second aperture-area to surface-area ratio is a second ratio, different than the first ratio.

20 Claims, 14 Drawing Sheets

(56) References Cited

U.S. PATENT DOCUMENTS

| | | | |
|---|---|---|---|
| 2006/0226018 A1* | 10/2006 | Iwazaki | C25D 5/08 |
| | | | 205/148 |
| 2013/0137242 A1 | 5/2013 | He et al. | |
| 2014/0151218 A1 | 6/2014 | Woodruff | |
| 2016/0362809 A1* | 12/2016 | Graham | C25D 17/001 |
| 2017/0152607 A1* | 6/2017 | Wang | C25D 17/008 |
| 2019/0055665 A1 | 2/2019 | Banik, II et al. | |

FOREIGN PATENT DOCUMENTS

| | | |
|---|---|---|
| CN | 111032927 A | 4/2020 |
| CN | 117210911 A | 12/2023 |
| TW | 201333276 A | 8/2013 |
| TW | 201612367 A | 4/2016 |
| TW | I572749 B | 3/2017 |

OTHER PUBLICATIONS

Wang, Chuan-bao, et al., "Research on the uniformity of the Gold layer thickness using non-cyanide electroplating on wafer", World Nonferrous Metals, 2016, Issue 8, 173-175.

Suwei, Chen, et al., "Double-Sided Gold Electroplating Technology for Wafers with High Thickness Uniformity", Semiconductor Technology, 2020, 45(10): 796-800.

\* cited by examiner

PLATING APPARATUS AND METHOD FOR ELECTROPLATING WAFER

RELATED APPLICATIONS

This application is a divisional of and claims priority to U.S. patent application Ser. No. 16/935,592, titled "PLATING APPARATUS AND METHOD FOR ELECTROPLATING WAFER" and filed on Jul. 22, 2020, which is incorporated herein by reference.

BACKGROUND

Semiconductor devices are used in a variety of electronic applications. The manufacture of semiconductor devices includes various processes, including electroplating semiconductor wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
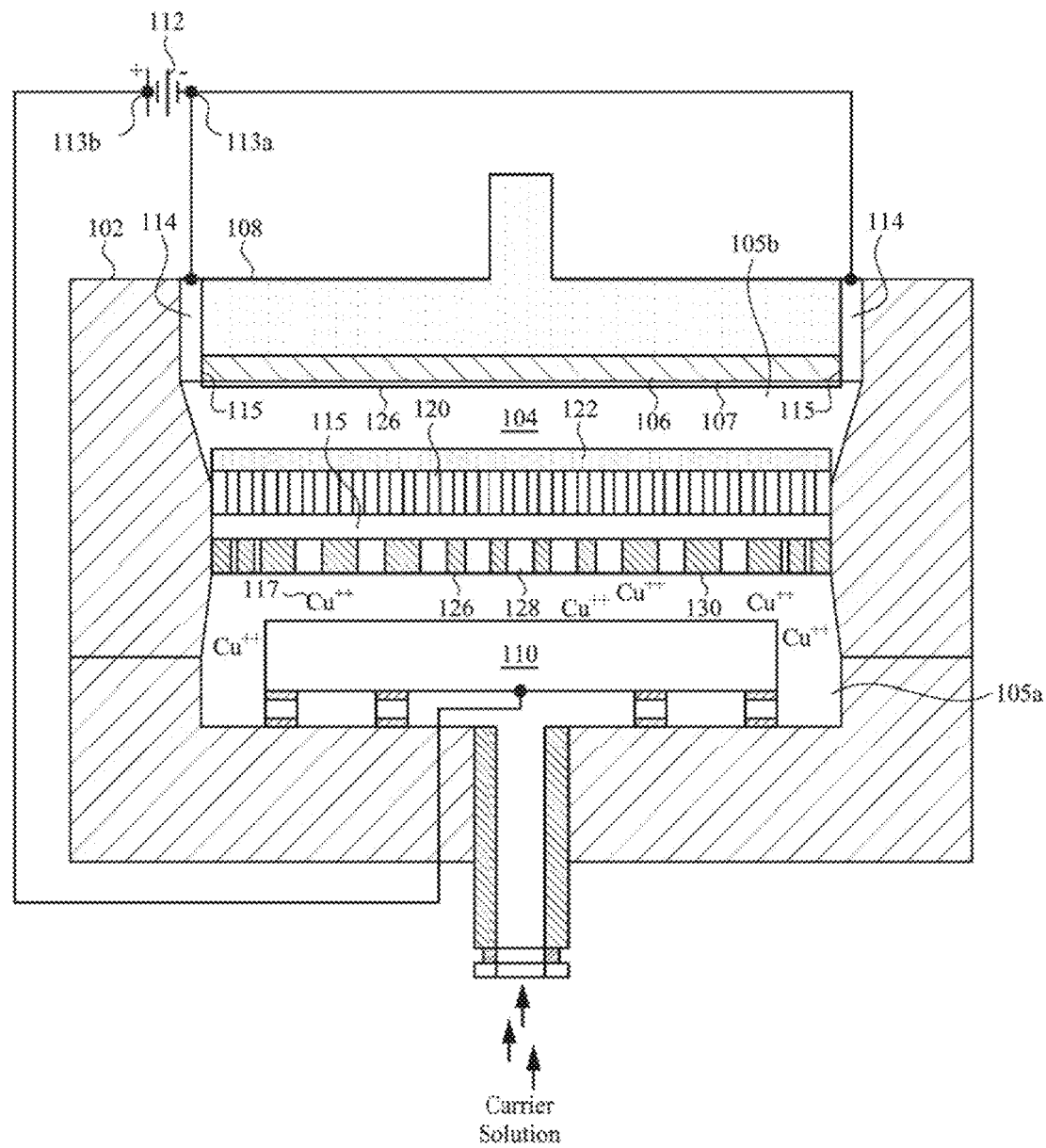
FIGS. 1, 2A, and 2B are illustrations of a plating apparatus for electroplating a wafer, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

A plating apparatus for electroplating a surface of a wafer with a metal film is disclosed. The plating apparatus directs a flow of ions of a metal to the wafer where the ions interact with the wafer to form the metal film, also referred to as a plating film, on the surface of the wafer. An ion shield is disposed in the plating apparatus between a source of the ions (e.g., such as a block or slab of the metal) and the wafer. The flow of ions to different portions of the wafer is guided by the configuration of the ion shield.

Components of the plating apparatus include a membrane support configured to mitigate sagging of an exchange membrane. In some embodiments, the membrane support is configured as the ion shield. Thus, the membrane support is configured to both inhibit the exchange membrane from sagging and to guide the flow of ions to different portions of the wafer. The membrane support includes ion blocking regions and ion flow-through regions (e.g., apertures formed through the membrane support). The flow of ions through the membrane support is greater through portions of the membrane support that have a greater area of ion flow-through regions than an area of ion blocking regions. Ions of the metal that are blocked by the ion blocking regions are redirected to flow through the ion flow-through regions. Some portions of the membrane support have a greater number or size of ion blocking regions than other portions of the membrane support. Thus, the flow of ions through portions of the membrane support that have a greater number or size of ion blocking regions is less than the flow of ions through portions of the membrane support that have a greater number or size of ion flow-through regions.

The plating apparatus includes a voltage source directly coupled to the source of the ions and to an outer portion or edge portion of the wafer. Ions of the metal flow from the source of the ions towards the wafer. When a voltage is applied to the wafer, ions of the metal interact with the wafer to form the metal film on the surface of the wafer. When the voltage is applied to the edge portion of the wafer, the strength of an electromagnetic field is stronger at the edge portion of the wafer than at the center portion of the wafer. Consequently, a greater concentration of ions of the metal are pulled towards the edge portion of the wafer than to the center portion of the wafer. However, the membrane support directs a greater flow of ions to the center portion of the wafer. The greater flow of ions to the center portion of the wafer compensates for the stronger electromagnetic field at the edge portions of the wafer to promote the formation of a metal film having a uniform thickness across the surface of the wafer.

FIG. 1 illustrates a plating apparatus 100 for electroplating a wafer 106. The plating apparatus 100 comprises a housing 102 defining a plating chamber 104 configured to house a carrier solution and a plating solution. The plating apparatus 100 comprises a wafer holding device 108 configured to hold the wafer 106 and immerse a surface 107 of the wafer 106 into the plating solution. The wafer holding device 108 comprises a chuck, a clamshell, or other device suitable for holding the wafer 106. According to some embodiments, a drive mechanism (not shown) is coupled to the wafer holding device 108 and is configured to lower the surface 107 into the plating solution and rotate, undulate, vibrate, or otherwise cause the wafer 106 to move in a manner that promotes the formation of a uniform plating film 126 over the surface 107. Other structures for holding the wafer 106 are within the scope of the present disclosure.

The plating apparatus 100 comprises an exchange membrane 120 disposed within the plating chamber 104. The exchange membrane 120 is an ion-selective semi-permeable membrane disposed between an anode region 105a and a cathode region 105b of the plating chamber 104. According to some embodiments, the anode region 105a houses the carrier solution and the cathode region 105b houses the plating solution. The exchange membrane 120 transports plating ions 117 from the anode region 105a to the cathode region 105b, while blocking other ions or particles in the anode region 105a from entry into the cathode region 105b. In some embodiments, the exchange membrane 120 is selective to positively charged ions and transports positively charged ions as the plating ions 117 from the anode region 105a to the cathode region 105b of the plating chamber 104 where the plating film 126 is formed. The exchange membrane 120 may comprise ionomeric materials such as per-flourinated co-polymers containing at least one of sulfonic groups, sulfonic polyimides, or other materials suitable for ion exchange. Other ion-selective exchange membranes or devices are within the scope of the present disclosure.

The carrier solution may comprise copper sulfate ($CuSO_4$) or other copper salts, such as at least one of copper fluoborate, copper gluconate, copper sulfamate, copper sulfonate, copper pyrophosphate, copper chloride, copper cyanide, or other suitable materials. The carrier solution may include salts, such as at least one of metal ligands, complexing agents, aluminum, or aqueous solutions of other salts of a plating metal, or other suitable materials to inhibit anode passivation and reduce anode sludge formation. Other materials for the carrier solution are within the scope of the present disclosure.

The plating apparatus 100 comprises an anode 110 immersed in the carrier solution within the anode region 105a of the plating chamber 104. According to some embodiments, the anode 110 comprises a metal or an alloy such as at least one of copper, brass, bronze, lead, antimonial lead, nickel, tin, silver, zinc, cadmium, or other suitable materials. The anode 110 is electrically coupled to a voltage source 112 comprising a first terminal 113a having a first polarity and a second terminal 113b having a second polarity different than the first polarity. In some embodiments, the first terminal 113a is a positive voltage terminal electrically coupled to the anode 110, and the second terminal 113b is a negative voltage terminal electrically coupled to electrical contacts 114 that are in electrical contact with edge portions 115 of the wafer 106. The voltage potential between the anode 110 and the wafer 106 creates an electromagnetic field from the anode 110 to the wafer 106, and an electrolytic cell is produced when a positive voltage is applied to the anode 110 and a negative voltage is applied to the wafer 106. As such, plating ions 117 in the carrier solution and the plating solution are attracted to the wafer 106. When near the wafer 106, the plating ions 117 gain electrons from the wafer 106 and deposit out of the plating solution onto the surface of the wafer 106 as the plating film 126. Other configurations for creating the electromagnetic field from the anode 110 to the wafer 106 are within the scope of the present disclosure.

Uniformity of the plating film 126 is dependent on the degree of uniformity of the electromagnetic field nearest the wafer 106 and the degree of uniformity of a number of plating ions 117 near the surface 107 of the wafer 106. Because the second terminal 113b of the voltage source 112 is in closer electrical contact with the edge portions 115 of the wafer 106 than other portions of the wafer 106, the electromagnetic field is stronger at the edge portions 115 of the wafer 106 than at other portions, such as the center portion of the wafer 106. However, non-uniformity of the electromagnetic field nearest the wafer 106 is compensated for by having a lesser flow rate of plating ions 117 towards the edge portions 115 of the wafer 106 than the flow rate of plating ions 117 towards other portions of the wafer 106, such as the center portion. As explained below, in some embodiments an ion shield is configured to direct different flow rates of plating ions 117 to different portions of the wafer 106. Directing a greater flow rate of plating ions 117 to the center portion of the wafer 106 than to the edge portions 115 offsets or compensates for the electromagnetic field being stronger at the edge portions 115 of the wafer 106 than at other portions. Directing a greater flow rate of plating ions 117 to the center portion of the wafer 106 promotes an even distribution of plating ions 117 across all portions of the wafer 106 when the electromagnetic field is stronger at the edge portions of the wafer 106. Consequently, the thickness of the plating film 126 is generally uniform across all portions of the wafer 106. Other devices that direct different flow rates of plating ions 117 to different portions of the wafer 106 are within the scope of the present disclosure.

The anode 110, the exchange membrane 120, a membrane support 116, a diffuser 122, and a diffuser holder 118 are disposed within the plating chamber 104. The diffuser holder 118 secures the diffuser 122 and secures the exchange membrane 120 over the membrane support 116. The membrane support 116 overlies the anode 110 and is configured to inhibit the exchange membrane 120 from sagging.

Figure 2A:
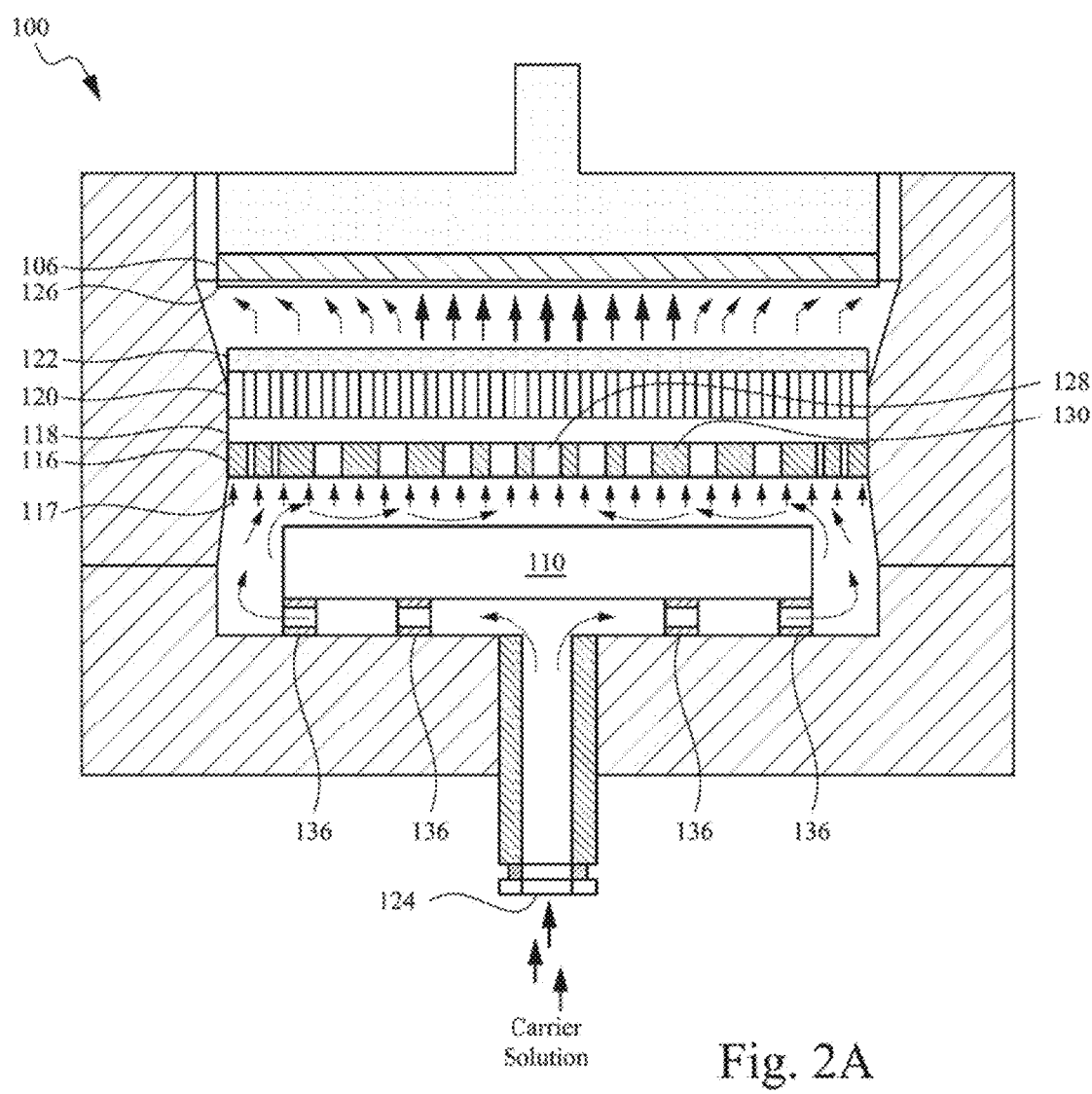

Referring to FIG. 2A, the plating apparatus 100 is configured to receive the carrier solution at inlet 124. The carrier solution may be pumped in at the inlet 124 by a pump (not shown) that provides force sufficient to circulate the carrier solution under the anode 110, through anode support structures 136, around and over the anode 110, and through the membrane support 116, the diffuser holder 118, the exchange membrane 120, and the diffuser 122. As the carrier solution circulates around the anode 110, the carrier solution extracts plating ions 117 from the anode 110. The plating ions 117, represented by the row of evenly weighted arrows under the membrane support 116, flow with the carrier solution through the membrane support 116 to the exchange membrane 120. The exchange membrane 120 is configured to allow selective ionic solution, referred to above as the plating solution, to pass therethrough to the diffuser 122. The diffuser 122 is configured to direct the plating solution to the wafer 106 at a uniform flow rate. In some embodiments, the diffuser 122 is a high resistance flow plate comprising insulating material (e.g. a polymer, ceramic, etc.), having many one-dimensional holes configured to provide flow resistance. The flow resistance helps stabilize formation of the plating film 126 on the wafer 106. Other devices that help stabilize formation of the plating film 126 are within the scope of the present disclosure.

An ion shield may be disposed between the anode 110 and the wafer 106 to direct different flow rates of plating ions 117 to different regions of the wafer 106. As represented by the heavier weighted arrows above the diffuser 122, the ion shield is configured to direct a heavier flow rate of plating ions 117 to the center portion of the wafer 106 and direct a lighter flow rate of plating ions 117 to edge portions of the wafer 106. In some embodiments, the membrane support 116 is configured as the ion shield. The membrane support 116 includes ion blocking regions 130 and apertures 128. The apertures 128 define ion flow-through regions through which selective ions, such as plating ions 117, pass. The apertures 128 are defined by removed or absent portions of the ion blocking regions 130 of the membrane support 116. The apertures 128 pass completely through the membrane support 116. Other devices configured to direct different flow rates of plating ions 117 to different regions of the wafer 106 are within the scope of the disclosure.

Figure 2B:
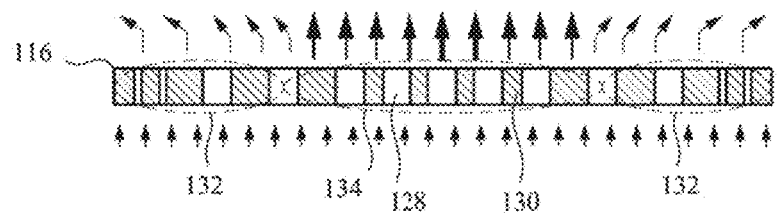

Referring to FIG. 2B, as represented by the heavier and lighter weighted arrows the membrane support 116 is configured to create a greater flow rate of plating ions 117 through an inner zone 134 and create a lesser flow rate of plating ions 117 through an outer zone 132. The ion blocking regions 130 are closed or shielded regions that block or substantially inhibit the flow of plating ions 117, and the apertures 128 are open regions that facilitate the flow of plating ions 117. Thus, the ion blocking regions 130 and the apertures 128 are configured to cause a greater flow rate of plating ions 117 through an inner zone 134 and cause a lesser flow rate of plating ions 117 through an outer zone 132. Referring back to FIG. 2A, at least a portion of the difference in flow rates through the membrane support 116 persists through the exchange membrane 120 and the diffuser 122 to the wafer 106, as illustrated by the heavier and lighter weighted arrows above the diffuser 122. Other configurations of the membrane support 116 are within the scope of the disclosure.

Figure 3:
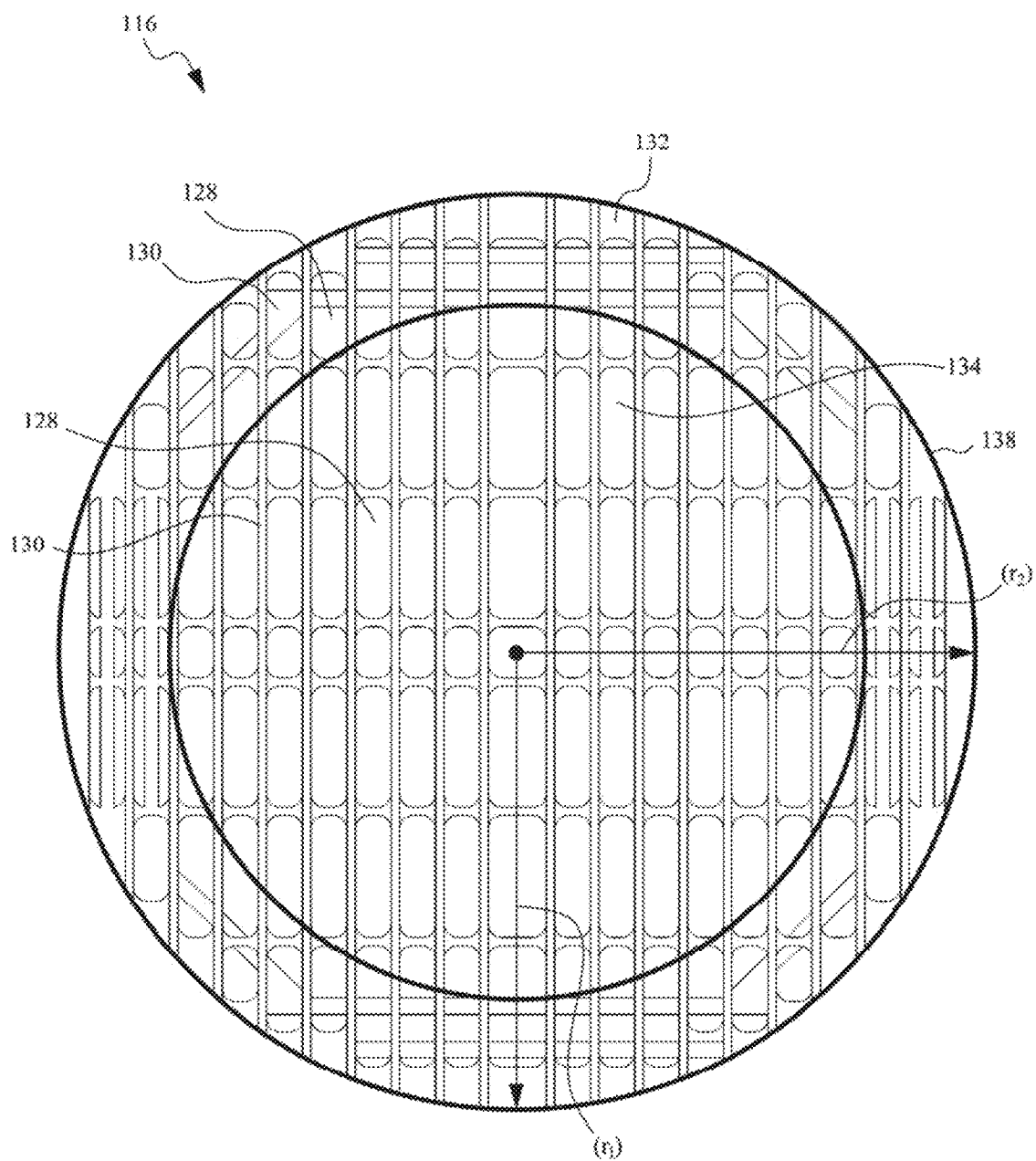
FIGS. 3-8 are illustrations of membrane supports of a plating apparatus for electroplating a wafer, according to some embodiments.

FIG. 3 is a top view of an embodiment of the membrane support 116. The membrane support 116 comprises the inner zone 134, the outer zone 132, and a periphery 138. The periphery 138 is directly adjacent to the outer zone 132. In some embodiments, another area, zone, or structure is between the periphery 138 and the outer zone 132 such that the periphery 138 is not directly adjacent to the outer zone 132.

The outer zone 132 of the membrane support 116 comprises apertures 128 and ion blocking regions 130. A first aperture-area to surface-area ratio is a first ratio of a first area of apertures in the outer zone 132 to a surface area of the outer zone 132. The surface area of the outer zone 132 is $\pi \cdot r_1^2 - \pi \cdot r_2^2$, where $r_1$ is the radius from the center of the membrane support 116 to an outermost edge of the outer zone 132 and $r_2$ is the radius from the center of the membrane support 116 to the innermost edge of the outer zone 132. In some embodiments, $r_2$ is 75-110 mm. In some embodiments, $r_1$ is 110-130 mm. The first area of apertures in the outer zone 132 is a summation of the areas of the apertures 128 in the outer zone 132.

The inner zone 134 of the membrane support 116 comprises apertures 128 and ion blocking regions 130. A second aperture-area to surface-area ratio is a second ratio of a second area of apertures in the inner zone 134 to a surface area of the inner zone 134. The surface area of the inner zone 134 is $\pi \cdot r_2^2$, and the second area of apertures in the inner zone 134 is a summation of the areas of the apertures 128 in the inner zone 134. The second aperture-area to surface-area ratio is greater than the first aperture-area to surface-area ratio. Because the second aperture-area to surface-area ratio is greater than the first aperture-area to surface-area ratio, the flow rate of plating ions 117 through the inner zone 134 is greater than the flow rate of plating ions 117 through the outer zone 132.

According to some embodiments, the first aperture-area to surface-area ratio is less than or equal to 11-to-21, and the second aperture-area to surface-area ratio is greater than or equal to 11-to-21. In some embodiments, where ratios are expressed as percentages, the first aperture-area to surface-area ratio is 25-50%, and the second aperture-area to surface-area ratio is 52-80%. In some embodiments, the second aperture-area to surface-area ratio is 5-30% greater than the first aperture-area to surface-area ratio. The difference between the first aperture-area to surface-area ratio and the second aperture-area to surface-area ratio provides a difference in the flow rate of plating ions 117 to the wafer 106 that is inversely proportional to a difference in the electromagnetic field at the edge portions of the wafer 106 to the electromagnetic field at the center portion of the wafer 106. Other first aperture-area to surface-area ratios and second aperture-area to surface-area ratios are within the scope of the disclosure.

The membrane support 116 comprises at least one of one of a polymer, a metal, a ceramic, or other suitable materials.

Figure 4:
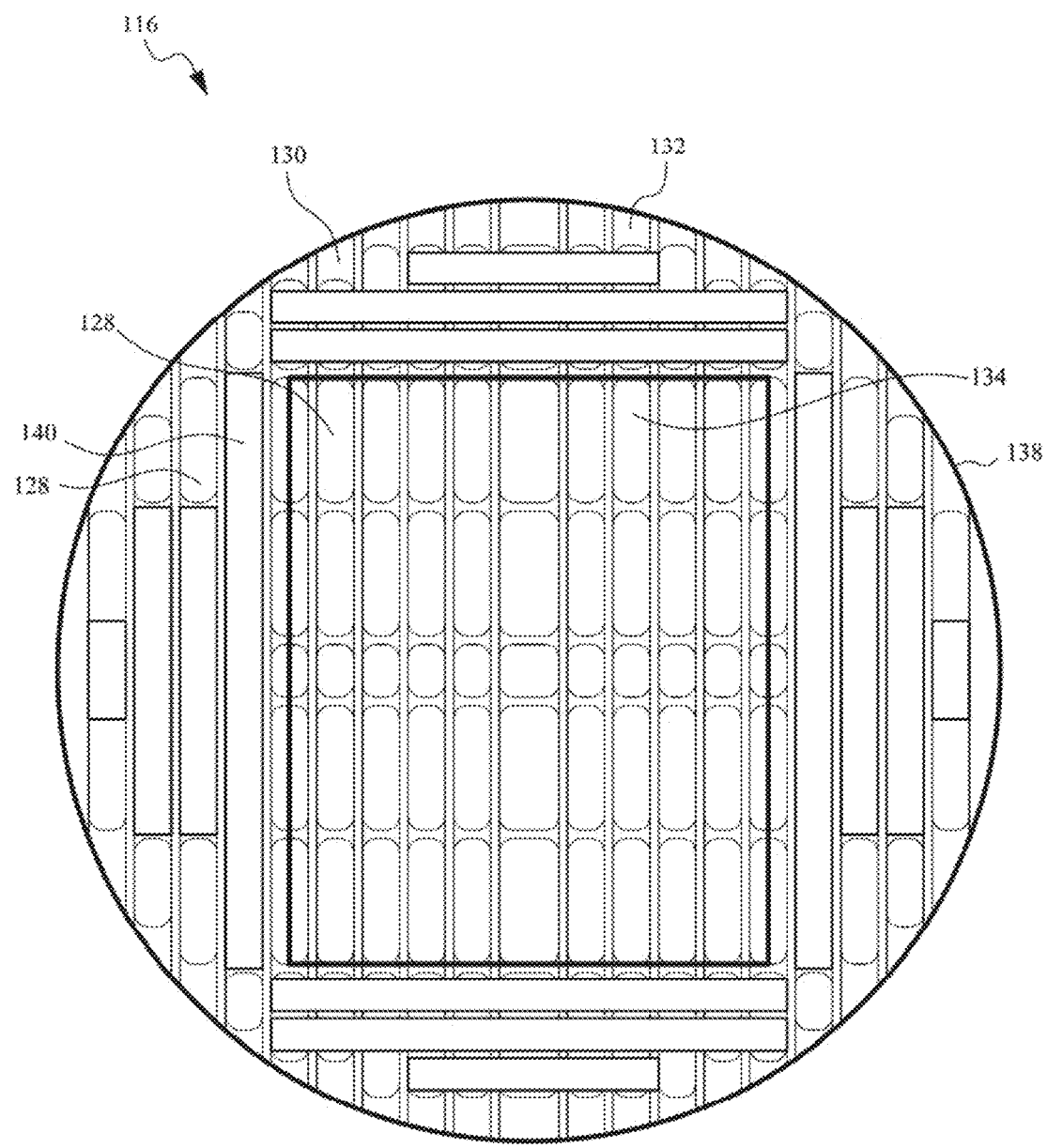

FIG. 4 is a top view of an embodiment of the membrane support 116. According to some embodiments, shields 140 are over or overlie fewer than all of the apertures in the outer zone 132. The shields 140 may be formed separate from the formation of the membrane support 116 and configured to be removably attached to the membrane support 116. Because the shields 140 can be attached or removed, the aperture-area to surface-area ratio of the outer zone 132 can be adjusted by either attaching shields 140 to the membrane support 116 or by removing shields 140 from the membrane support 116. Thus, the flow rate of plating ions 117 to the edge portions 115 of the wafer 106 may be increased or decreased by removing or attaching shields 140 from/to the membrane support 116. The shields 140 comprise at least one of one of a polymer, a ceramic, or other suitable materials. The shields 140 are at least one of one of polygonal, elliptical, uniform, non-uniform, or other suitable shapes. In some embodiments, the shields 140 comprise hooks, snaps, fasteners, or other suitable mechanisms for attachment to the membrane support 116. The shields 140 may be bonded to the membrane support 116 by at least one of one of glue, heat treatment, chemical treatment, or other suitable bonding techniques. Although not illustrated, the shields 140 may additionally or alternatively be placed over apertures in the inner zone 134 to control the flow rate of plating ions 117 to central portions of the wafer 106.

Figure 5:
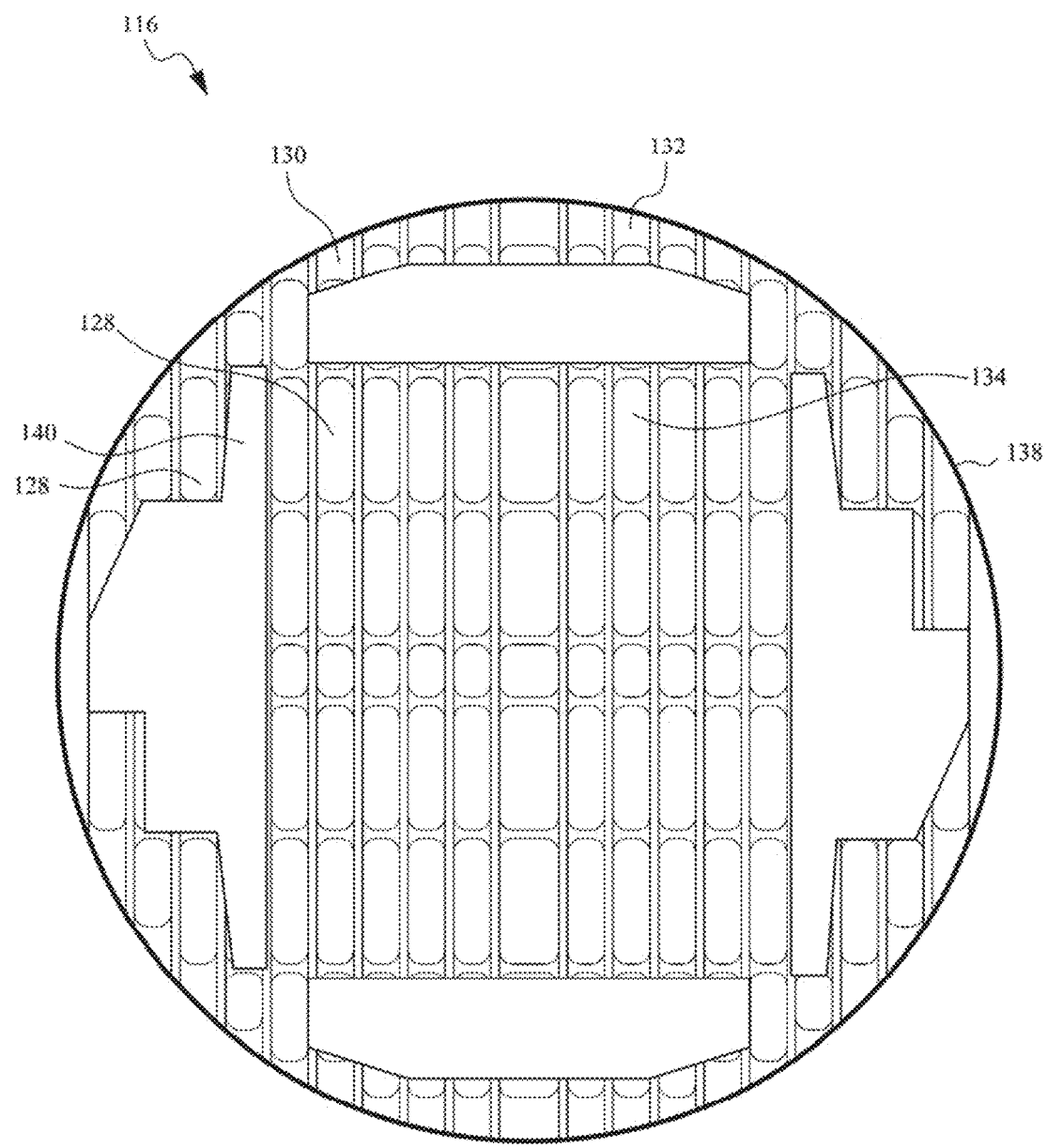

FIG. 5 is a top view of an embodiment of the membrane support 116 in which some of the apertures in the outer zone 132 are covered by shields 140 that are formed in or on the membrane support 116. Shields 140 that are formed in or on the membrane support 116 may reduce manufacturing and handling costs compared to manufacturing and handling costs of removably attachable shields 140, such as those of FIG. 4. Although not illustrated, the shields 140 may additionally or alternatively be formed in or on the inner zone 134 of the membrane support 116.

Figure 6:
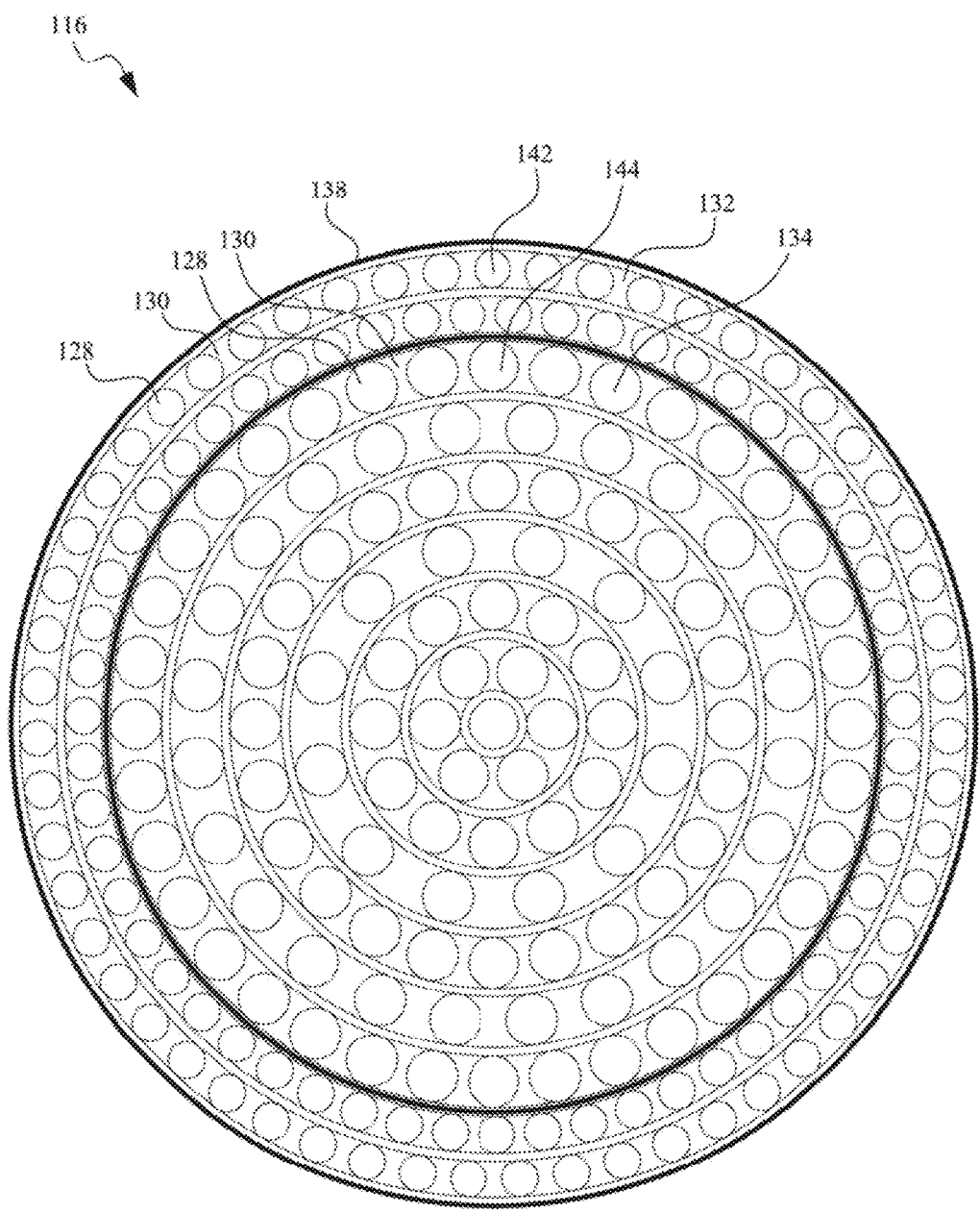

FIG. 6 is a top view of an embodiment of the membrane support 116 in which the apertures 128 are ellipses. First ellipses 142 are arranged in concentric circles in the outer zone 132, and second ellipses 144 are arranged in concentric circles in the inner zone 134. In some embodiments, the first ellipses 142 and the second ellipses 144 are circular. The first ellipses 142 have a first diameter and the second ellipses 144 have a second diameter. The second diameter may be less than, equal to, or greater than the first diameter. The first ellipses 142 may be arranged in other than concentric circles, such as in a non-uniform arrangement or distribution. The second ellipses 144 may be arranged in other than concentric circles, such as in a non-uniform arrangement or distribution. The first ellipses 142 may vary in shape and/or size relative to one another and/or relative to at least some of the second ellipses 144. The second ellipses 144 may vary in shape and/or size relative to one another and/or relative to at least some of the first ellipses 142.

Figure 7:
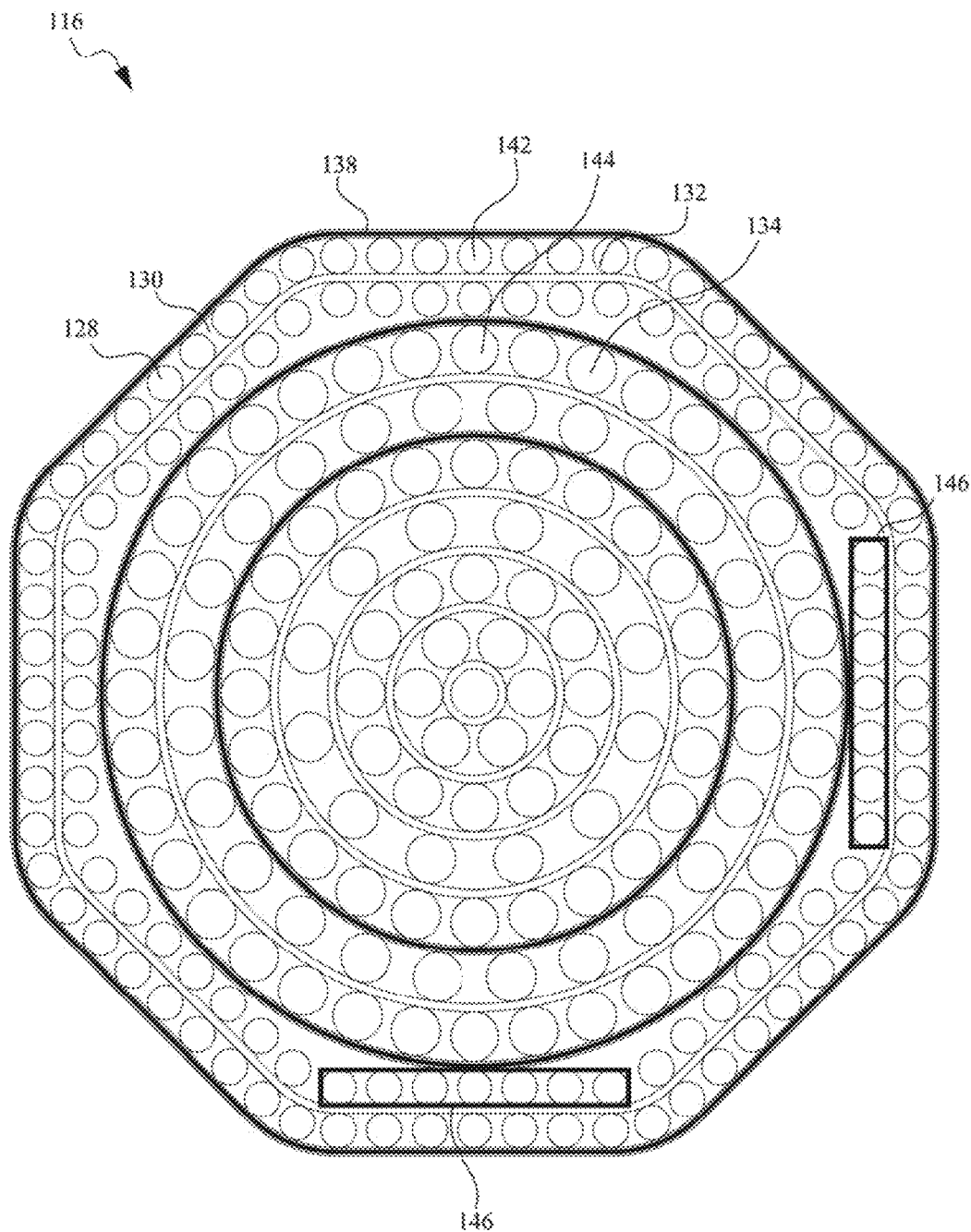

FIG. 7 is a top view of an embodiment of the membrane support 116 in which the apertures 128 are ellipses. First ellipses 142 are arranged in linked linear groups 146 in the outer zone 132, and second ellipses 144 are arranged in concentric circles in the inner zone 134. In some embodiments, the first ellipses 142 and the second ellipses 144 are circular. The first ellipses 142 have a first diameter and the second ellipses 144 have a second diameter. The second diameter may be less than, equal to, or greater than the first diameter. The first ellipses 142 may be arranged in other than linked linear groups 146. The second ellipses 144 may be arranged in other than concentric circles, such as in linked linear groups, a non-uniform arrangement or distribution, etc. The first ellipses 142 may vary in shape and/or size relative to one another and/or relative to at least some of the second ellipses 144. The second ellipses 144 may vary in shape and/or size relative to one another and/or relative to at least some of the first ellipses 142.

Figure 8:
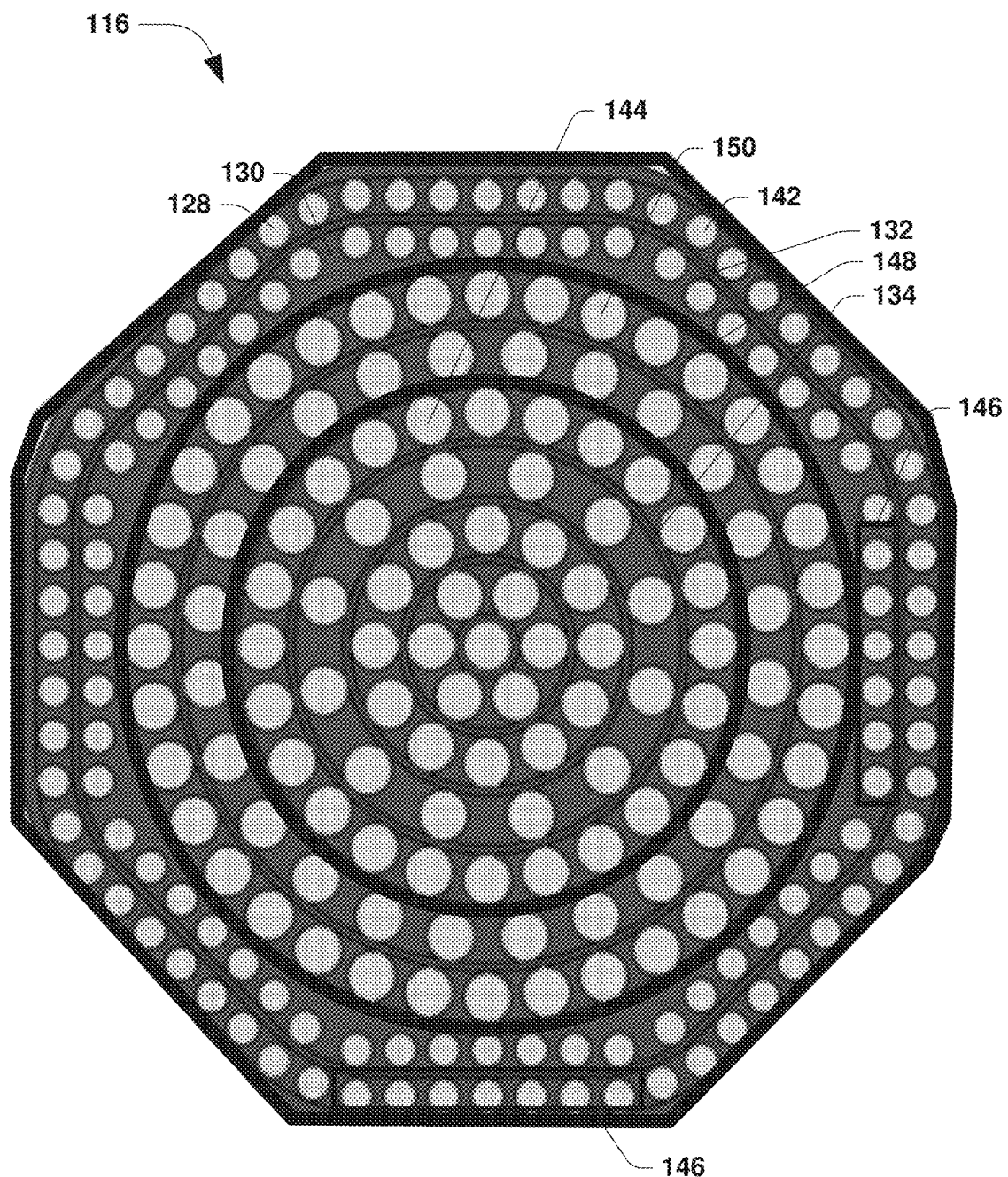

FIG. 8 is a top view of an embodiment of the membrane support 116 in which there are three zones. First ellipses 142 are arranged in linked linear groups 146 in the outer zone 132, second ellipses 144 are arranged in concentric circles in the inner zone 134, and third ellipses 150 are arranged in concentric circles in a middle zone 148. The middle zone 148 is between the outer zone 132 and the inner zone 134. In some embodiments, the first ellipses 142, the second ellipses 144, and the third ellipses 150 are circular. The first ellipses 142 have a first diameter, the second ellipses 144 have a second diameter, and the third ellipses have a third diameter. In some embodiments, the third diameter is greater than the second diameter, and the second diameter is greater than the first diameter. Other configurations of the membrane support 116 are within the scope of the disclosure.

Figure 9:
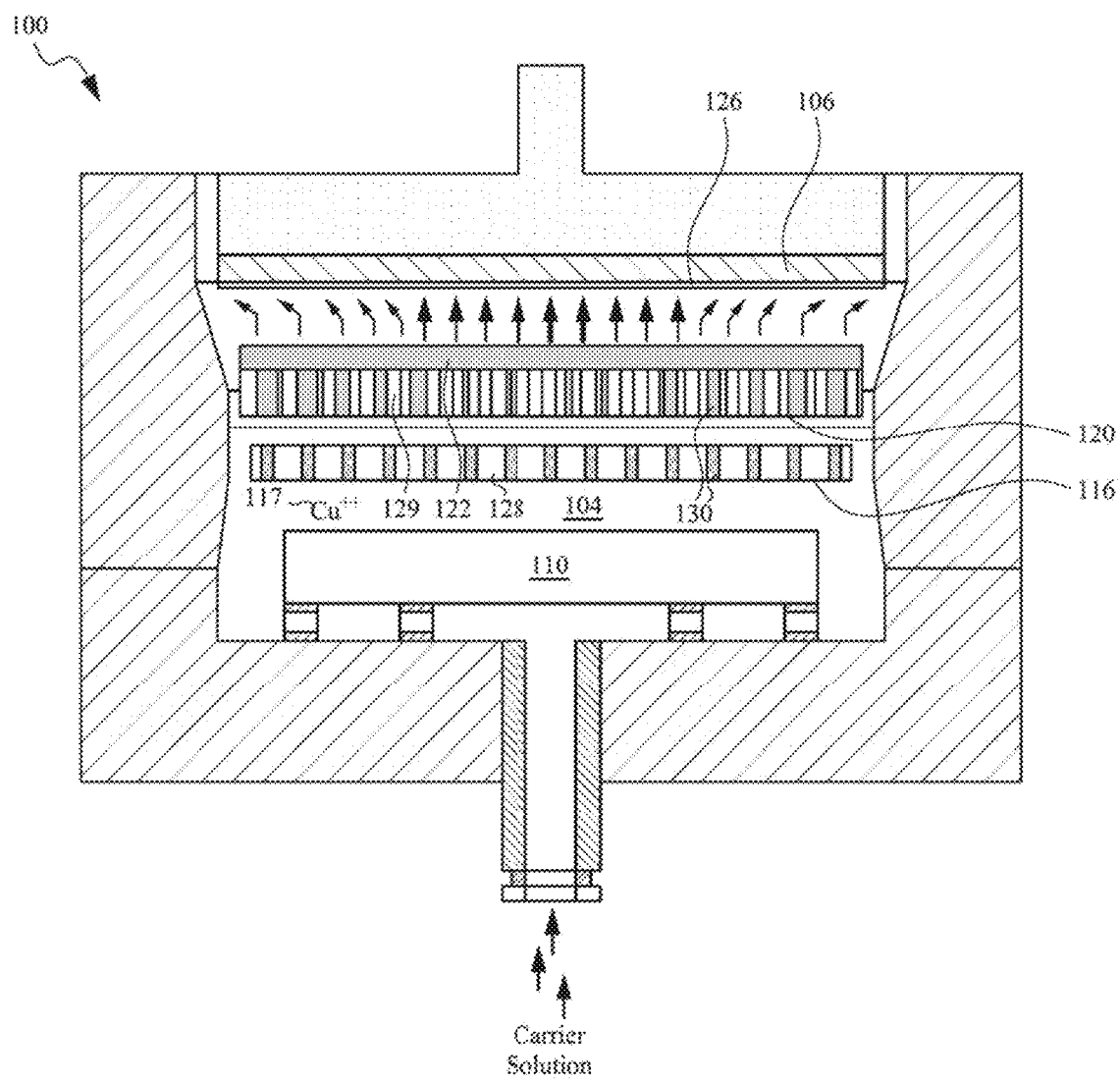
FIGS. 9-12 are illustrations of a plating apparatus for electroplating a wafer, according to some embodiments.

FIG. 9 illustrates a plating apparatus 100 for electroplating a wafer 106. The configuration of the plating apparatus 100 of FIG. 9 is similar to the plating apparatus 100 of FIG. 1. Therefore, some features of the plating apparatus 100 of FIG. 9 are not discussed herein to, at least, avoid repetition of disclosure.

The plating apparatus 100 comprises a membrane support 116 having consistently spaced apertures 128 and ion blocking regions 130. Therefore, the membrane support 116 is not configured to redirect the flow of ions through the plating chamber 104. However, the exchange membrane 120 includes unblocked regions 129 and ion blocking regions 130. The unblocked regions 129 define ion flow-through regions through which selective ions, such as plating ions, pass. The unblocked regions 129 are defined by removed or absent portions of the ion blocking regions 130. A ratio of ion flow-through regions to ion blocking regions is defined as a ratio of unblocked regions 129 to a surface area of the exchange membrane 120.

The ion blocking regions 130 and the unblocked regions 129 are configured to cause a greater flow rate of plating ions 117 through an inner zone of the exchange membrane 120 and cause a lesser flow rate of plating ions 117 through an outer zone of the exchange membrane 120. At least a portion of the difference in flow rates through the exchange membrane 120 persists through the diffuser 122 to the wafer 106, as illustrated by the heavier and lighter weighted arrows above the diffuser 122. Directing a greater flow rate of plating ions 117 to the center portion of the wafer 106 promotes an even distribution of plating ions 117 across all portions of the wafer 106 when the electromagnetic field is stronger at the edge portions of the wafer 106. Consequently, the thickness of the plating film 126 is generally uniform across all portions of the wafer 106. Other devices that direct different flow rates of plating ions 117 to different portions of the wafer 106 are within the scope of the present disclosure.

Figure 10:
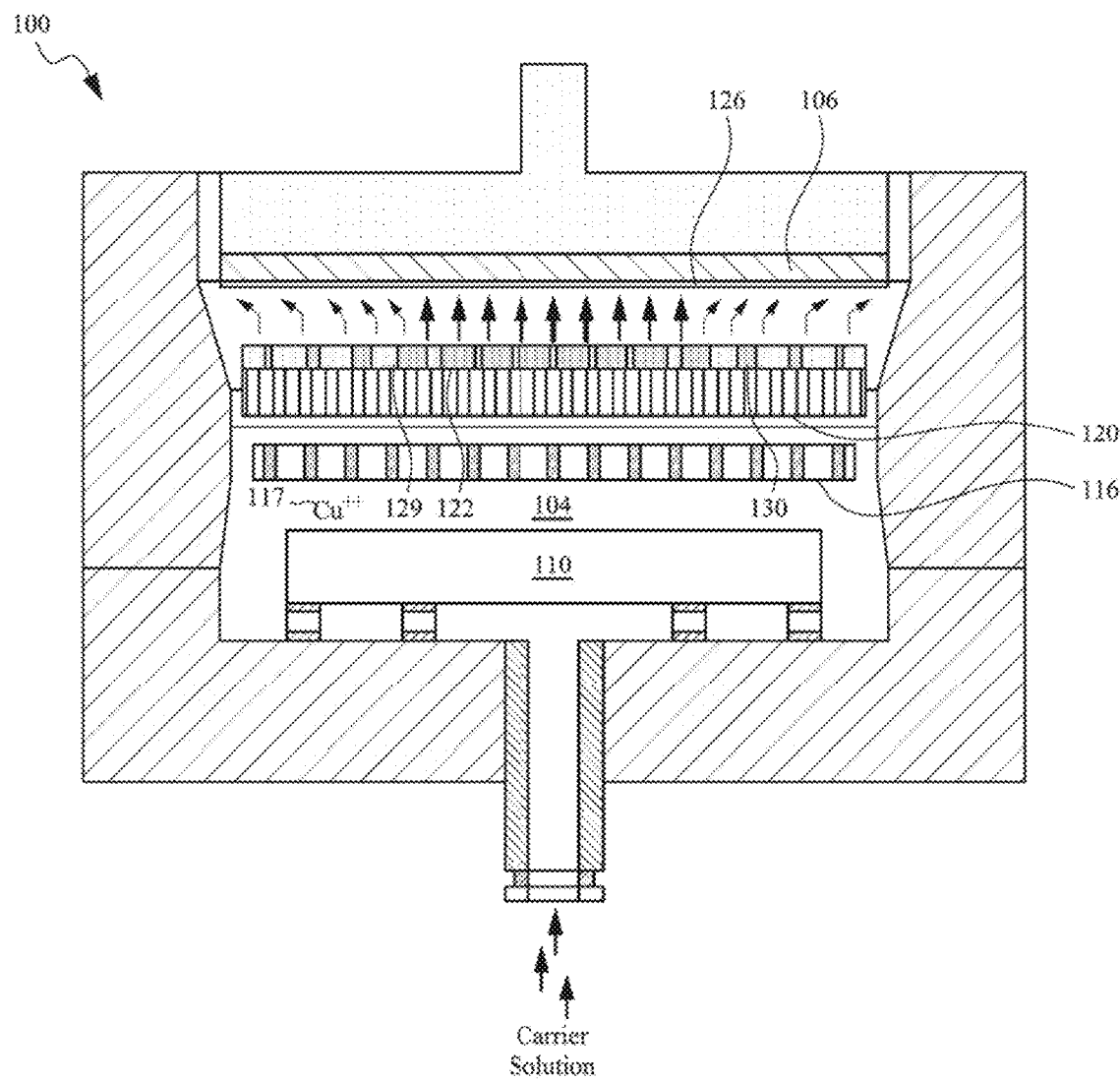

FIG. 10 illustrates a plating apparatus 100 for electroplating a wafer 106. The configuration of the plating apparatus 100 of FIG. 10 is similar to the plating apparatus 100 of FIG. 1. Therefore, some features of the plating apparatus 100 of FIG. 10 are not discussed herein to, at least, avoid repetition of disclosure.

The plating apparatus 100 comprises a membrane support 116 having consistently spaced apertures 128 and ion blocking regions 130. Therefore, the membrane support 116 is not configured to redirect the flow of ions through the plating chamber 104. However, the diffuser 122 includes unblocked regions 129 and ion blocking regions 130. The unblocked regions 129 define ion flow-through regions through which plating ions pass. The unblocked regions 129 are defined by removed or absent portions of the ion blocking regions 130. A ratio of ion flow-through regions to ion blocking regions is defined as a ratio of unblocked regions 129 to a surface area of the diffuser 122.

The ion blocking regions 130 and the unblocked regions 129 are configured to cause a greater flow rate of plating ions 117 through an inner zone of the diffuser 122 and cause a lesser flow rate of plating ions 117 through an outer zone of the diffuser 122. Directing a greater flow rate of plating ions 117 to the center portion of the wafer 106 promotes an even distribution of plating ions 117 across all portions of the wafer 106 when the electromagnetic field is stronger at the edge portions of the wafer 106. Consequently, the thickness of the plating film 126 is generally uniform across all portions of the wafer 106. Other devices that direct different flow rates of plating ions 117 to different portions of the wafer 106 are within the scope of the present disclosure.

Figure 11:
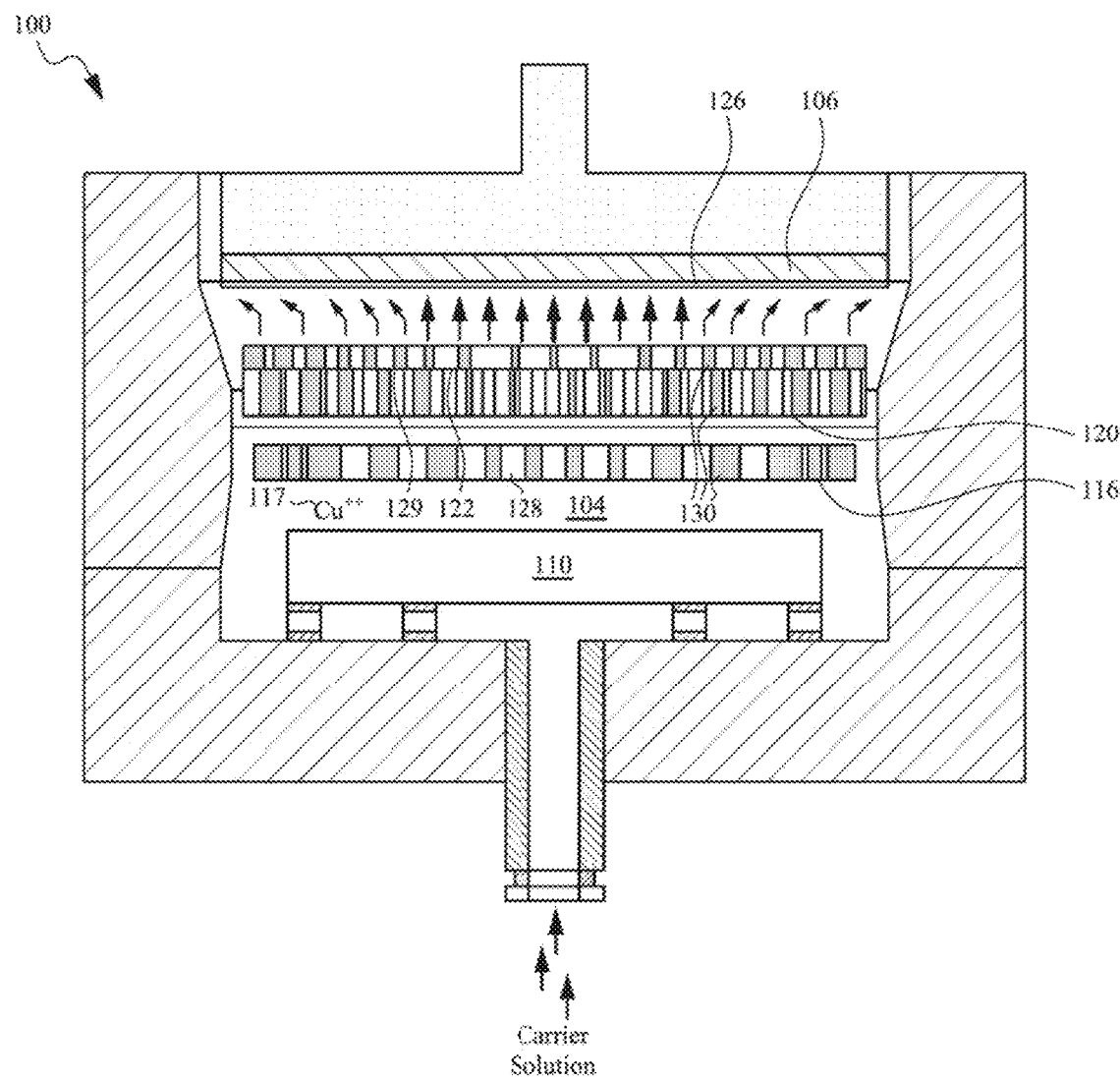

FIG. 11 illustrates a plating apparatus 100 for electroplating a wafer 106. The configuration of the plating apparatus 100 of FIG. 11 is similar to the plating apparatus 100 of FIG. 1. Therefore, some features of the plating apparatus 100 of FIG. 11 are not discussed herein to, at least, avoid repetition of disclosure.

The plating apparatus 100 comprises a membrane support 116, an exchange membrane 120, and a diffuser 122. The membrane support 116 includes apertures 128 and ion blocking regions 130. The apertures 128 define ion flow-through regions through which plating ions pass. The apertures 128 are defined by removed or absent portions of the ion blocking regions 130.

The exchange membrane 120 and the diffuser 122 each include unblocked regions 129 and ion blocking regions 130. The unblocked regions 129 define ion flow-through regions through which plating ions pass. The unblocked regions 129 are defined by removed or absent portions of the ion blocking regions 130.

The apertures 128, the unblocked regions 129, and the ion blocking regions 130 are configured to cause a greater flow rate of plating ions 117 through inner zones of the membrane support 116, the exchange membrane 120, and the diffuser 122 and cause a lesser flow rate of plating ions 117 through outer zones of the membrane support 116, the exchange membrane 120, and the diffuser 122. Directing a greater flow rate of plating ions 117 to the center portion of the wafer 106 promotes an even distribution of plating ions 117 across all portions of the wafer 106 when the electromagnetic field is stronger at the edge portions of the wafer 106. Consequently, the thickness of the plating film 126 is generally uniform across all portions of the wafer 106. Other devices that direct different flow rates of plating ions 117 to different portions of the wafer 106 are within the scope of the present disclosure.

Figure 12:
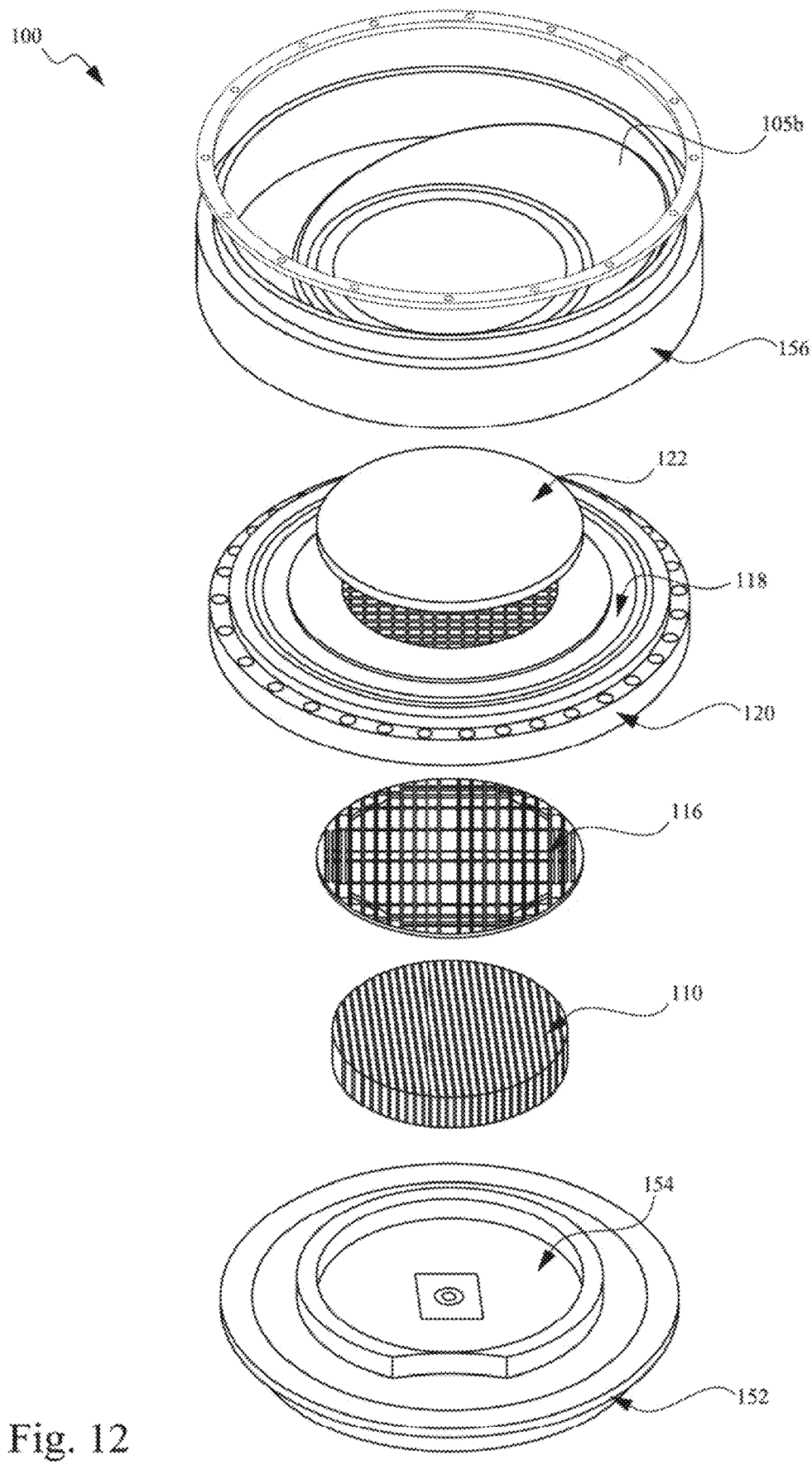

FIG. 12 illustrates a plating apparatus 100, according to some embodiments. The configuration of the plating apparatus 100 of FIG. 12 is similar to the plating apparatus 100 of FIG. 1. Therefore, some features of the plating apparatus 100 of FIG. 12 are not discussed herein to, at least, avoid repetition of disclosure.

The plating apparatus 100 comprises a manifold 152 configured to receive a carrier solution and support an anode holder 154. The anode holder 154 is configured to secure the anode 110. The diffuser holder 118 is configured to secure the exchange membrane 120 and the diffuser 122. The membrane support 116 is configured to mitigate sagging of the exchange membrane 120. A cell top 156 overlies the diffuser 122 and defines the cathode region 105b of the plating chamber 104. Other configurations of the plating apparatus are within the scope of the disclosure.

Figure 13:
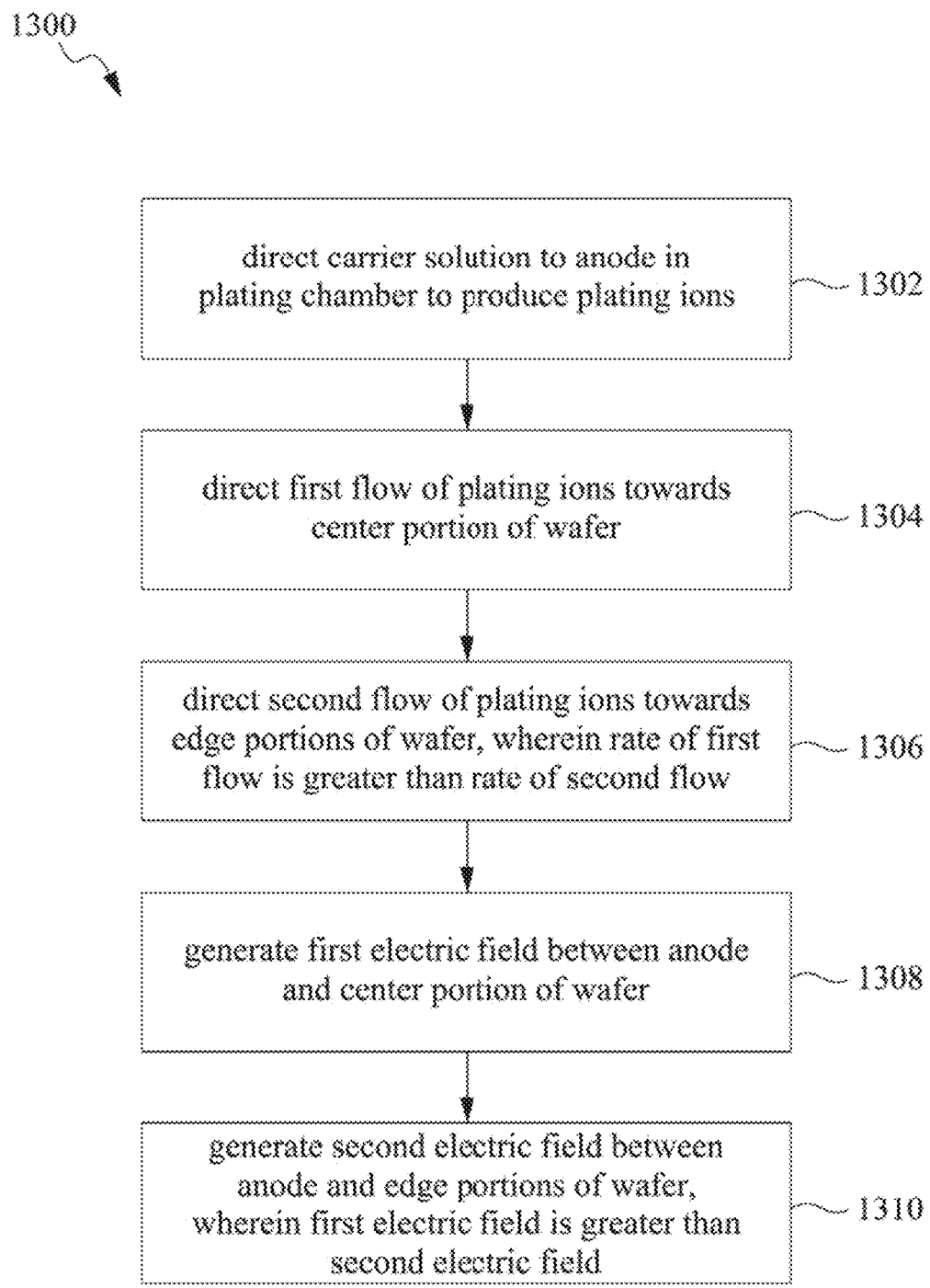
FIG. 13 illustrates a method for electroplating a wafer, according to some embodiments.

FIG. 13 illustrates a method 1300 for electroplating a wafer, according to some embodiments. At 1302, a carrier solution is directed to an anode 110 in a plating chamber to produce plating ions. At 1304, a first flow of plating ions is directed towards a center portion of the wafer. At 1306, a second flow of plating ions is directed towards edge portions of the wafer. The rate of the first flow is greater than the rate of the second flow. At 1308, a first electric field is generated between the anode and the center portion of the wafer. At 1310, a second electric field is generated between the anode and the edge portions of the wafer, wherein the first electric field is greater than the second electric field. Other or alternative acts of a method for plating a wafer are within the scope of the disclosure. The method 1300 is not limited to the disclosed structure, but is applicable to other suitable structures.

Figure 14:
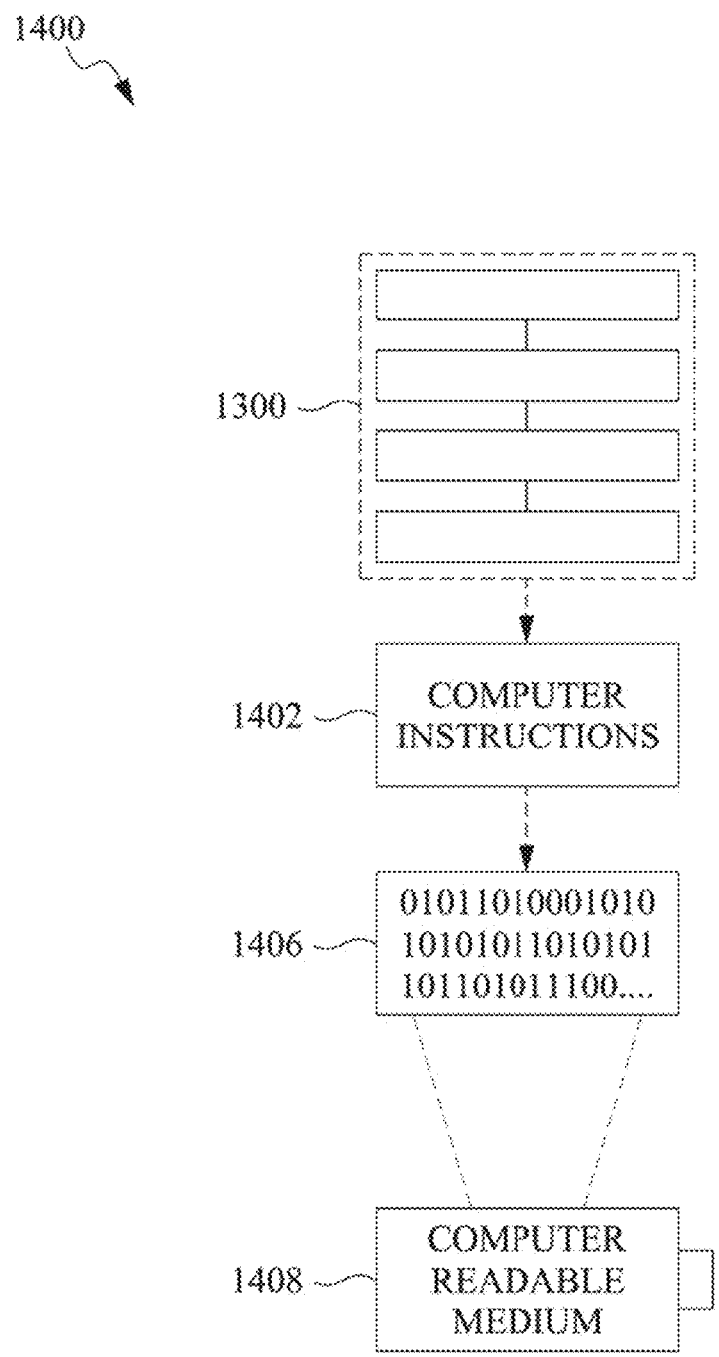
FIG. 14 illustrates an exemplary computer-readable medium, according to some embodiments.

FIG. 14 illustrates an exemplary computer-readable medium, according to some embodiments. One or more embodiments involve a computer-readable medium comprising processor-executable instructions configured to implement one or more of the techniques presented herein. An exemplary computer-readable medium is illustrated in FIG. 14, wherein the embodiment 1400 comprises a computer-readable medium 1408 (e.g., a CD-R, DVD-R, flash drive, a platter of a hard disk drive, etc.), on which is encoded computer-readable data 1406. This computer-readable data 1406 in turn comprises a set of processor-executable computer instructions 1402 that when executed are configured to facilitate operations according to one or more of the principles set forth herein. In some embodiments 1400, the processor-executable computer instructions 1402 are configured to facilitate performance of a method 1300, such as at least some of the aforementioned method(s). In some embodiments, the processor-executable computer instructions 1402 are configured to facilitate implementation a system, such as at least some of the one or more aforementioned system(s). Many such computer-readable media may be devised by those of ordinary skill in the art that are configured to operate in accordance with the techniques presented herein.

A plating apparatus 100 of the disclosure includes an ion shield, such as one or more of one of a membrane support 116, an exchange membrane 120, or a diffuser 122 configured as an ion shield. The ion shield directs the flow of plating ions 117 away from edge portions of a wafer 106 and towards center portions of the wafer 106. The ion shield comprises at least one of one of ion blocking regions 130, apertures 128, or unblocked regions 129. The ion blocking regions 130 are closed or shielded regions that inhibit the flow of plating ions 117, and the apertures 128 and unblocked regions 129 are open regions that facilitate the flow of plating ions 117. The ion blocking regions 130, the apertures 128, and the unblocked regions 129 are configured to cause a greater flow rate of plating ions 117 towards center portions of the wafer 106 and cause a lesser flow rate of plating ions 117 towards edge portions of the wafer 106. The greater flow of plating ions 117 to the center portion of the wafer 106 compensates for a stronger electromagnetic field at the edge portions of the wafer 106 to promote the formation of a plating film 126 having a uniform thickness across the surface of the wafer 106.

A plating apparatus for electroplating a wafer includes a housing defining a plating chamber for housing a plating solution, a voltage source including a first terminal having a first polarity and a second terminal having a second polarity different than the first polarity, wherein the first terminal is electrically coupled to the wafer, an anode within the plating chamber, wherein the second terminal is electrically coupled to the anode, and a membrane support within the plating chamber and over the anode, wherein the membrane support defines apertures, wherein in a first zone of the membrane support a first aperture-area to surface-area ratio is a first ratio, and in a second zone of the membrane support a second aperture-area to surface-area ratio is a second ratio, different than the first ratio.

A plating apparatus for electroplating a wafer includes an inlet for receiving a carrier solution, an anode over the inlet, wherein the anode includes plating atoms for chemically reacting with the carrier solution to produce plating ions, and an ion shield over the anode, wherein a first aperture is defined within the ion shield at a first location, a second aperture is defined within the ion shield at a second location different than the first location, and a first area of the ion shield removed to form the first aperture is greater than a second area of the ion shield removed to form the second aperture.

A method for plating a wafer includes directing a carrier solution to an anode in a plating chamber to produce plating ions, directing a first flow of the plating ions towards a center portion of the wafer, and directing a second flow of the plating ions towards edge portions of the wafer, wherein a rate of the first flow is greater than a rate of the second flow.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for plating a wafer, comprising:
directing a carrier solution to an anode in a plating chamber to produce plating ions;
directing a first flow of the plating ions towards a center portion of the wafer; and
directing a second flow of the plating ions towards edge portions of the wafer, wherein a rate of the first flow is greater than a rate of the second flow, wherein:
directing the first flow of the plating ions and the second flow of the plating ions comprises:
controlling a rate at which the plating ions flow from the anode toward the wafer using a structure comprising a membrane support comprising ion blocking regions that define a plurality of apertures,
apertures of the plurality of apertures in a first zone of the membrane support have a first diameter,
apertures of the plurality of apertures in a second zone of the membrane support have a second diameter,
apertures of the plurality of apertures in a third zone of the membrane support have a third diameter,
the third diameter is larger than the first diameter and larger than the second diameter, and
the third zone is between the first zone and the second zone.

2. The method of claim 1, comprising:
generating a first electric field between the anode and the center portion of the wafer; and
generating a second electric field between the anode and the edge portions of the wafer, wherein the first electric field is greater than the second electric field.

3. The method of claim 1, wherein:
directing the first flow of the plating ions towards the center portion of the wafer comprises generating a first electric field from the anode to the wafer, and
directing the second flow of the plating ions towards the edge portions of the wafer comprises generating a second electric field from the anode to the wafer.

4. The method of claim 1, wherein:
in the first zone, a first aperture-area to surface-area ratio is a first ratio,
in the second zone, a second aperture-area to surface- area ratio is a second ratio, different than the first ratio,
in the third zone, a third aperture-area to surface-area ratio is a third ratio, and
the third ratio is greater than the first ratio and the second ratio.

5. The method of claim 1, comprising selectively inhibiting a portion of the plating ions from flowing towards the wafer based upon a charge of the portion of the plating ions.

6. The method of claim 5, wherein:
selectively inhibiting the portion of the plating ions comprises selectively inhibiting the portion of the plating ions using an exchange membrane, and
controlling the rate at which the plating ions flow from the anode toward the wafer comprises controlling the rate using the exchange membrane.

7. The method of claim 5, wherein:
selectively inhibiting the portion of the plating ions comprises selectively inhibiting the portion of the plating ions using an exchange membrane, and
the structure comprises a diffuser disposed in a flow path of the plating ions between the exchange membrane and the wafer.

8. The method of claim 5, wherein:
selectively inhibiting the portion of the plating ions comprises selectively inhibiting the portion of the plating ions using an exchange membrane, and
the membrane support is configured to support the exchange membrane.

9. The method of claim 8, wherein the membrane support is disposed in a flow path of the plating ions between the anode and the exchange membrane.

10. A method for plating a wafer, comprising:
directing a carrier solution to an anode in a plating chamber to produce plating ions; and
controlling a rate at which the plating ions flow from the anode toward the wafer using a structure comprising a membrane support comprising ion blocking regions that define a plurality of apertures, wherein:
apertures of the plurality of apertures in a first zone of the membrane support have a first diameter,
apertures of the plurality of apertures in a second zone of the membrane support have a second diameter,
apertures of the plurality of apertures in a third zone of the membrane support have a third diameter,
the third diameter is larger than the first diameter and larger than the second diameter, and
the third zone is between the first zone and the second zone.

11. The method of claim 10, wherein:
in the first zone, a first aperture-area to surface-area ratio is a first ratio,
in the second zone, a second aperture-area to surface-area ratio is a second ratio, different than the first ratio,
in the third zone, a third aperture-area to surface-area ratio is a third ratio, and
the third ratio is greater than the first ratio and the second ratio.

12. The method of claim 10, wherein:
controlling the rate at which the plating ions flow from the anode toward the wafer comprises controlling a rate at which the plating ions flow toward a center portion of the wafer to be greater than a rate at which the plating ions flow toward an edge portion of the wafer.

13. The method of claim 12, wherein:
a difference between the rate at which the plating ions flow toward the center portion of the wafer and the rate at which the plating ions flow toward the edge portion of the wafer is inversely proportional to a difference between a strength of an electromagnetic field at the center portion of the wafer and a strength of the electromagnetic field at the edge portion of the wafer.

14. A method for plating a wafer, comprising:
directing a carrier solution to an anode in a plating chamber to produce plating ions; and
controlling a rate at which the plating ions flow toward a center portion of the wafer to be different than a rate at which the plating ions flow toward an edge portion of the wafer, wherein:
a difference between the rate at which the plating ions flow toward the center portion of the wafer and the rate at which the plating ions flow toward the edge portion of the wafer is inversely proportional to a difference between a strength of an electromagnetic field at the center portion of the wafer and a strength of the electromagnetic field at the edge portion of the wafer, and
controlling the rate at which the plating ions flow toward the center portion of the wafer to be different than the rate at which the plating ions flow toward the edge portion of the wafer comprises:
controlling a rate at which the plating ions flow from the anode toward the wafer using a structure comprising ion blocking regions that define a plurality of apertures,
the structure defines a first zone of apertures arranged in a ring, and
the structure defines a second zone of apertures arranged in linear groups to define an octagonal shape.

15. The method of claim 14, comprising:
selectively inhibiting a portion of the plating ions from flowing towards the wafer based upon a charge of the portion of the plating ions.

16. The method of claim 14, wherein each of the linear groups comprises at least three apertures arranged linearly.

17. The method of claim 14, wherein, in the second zone, at least three apertures and not more than seven apertures of the plurality of apertures are arranged linearly to define a linked linear group.

18. The method of claim 14, wherein:
the structure defines a third zone of apertures arranged in a ring,
apertures of the plurality of apertures in the first zone have a first diameter,
apertures of the plurality of apertures in the second zone have a second diameter,
apertures of the plurality of apertures in the third zone have a third diameter,
the third diameter is larger than the first diameter and larger than the second diameter, and
the third zone is between the first zone and the second zone.

19. The method of claim 14, wherein:
the structure defines a third zone of apertures arranged in a ring,
in the first zone, a first aperture-area to surface-area ratio is a first ratio,
in the second zone, a second aperture-area to surface-area ratio is a second ratio, different than the first ratio,
in the third zone, a third aperture-area to surface-area ratio is a third ratio, and
the third ratio is greater than the first ratio and the second ratio.

20. The method of claim 19, wherein the third zone is between the first zone and the second zone.

* * * * *